(12) United States Patent
Koazechi (10) Patent No.: US 6,366,161 B1
(45) Date of Patent: *Apr. 2, 2002

(54) ACTIVE FILTER CIRCUIT

(75) Inventor: Shinichi Koazechi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/210,729

(22) Filed: Dec. 15, 1998

(30) Foreign Application Priority Data

Dec. 15, 1997 (JP) ............................................... 9-345592

(51) Int. Cl.[7] .................................................. H03K 5/00
(52) U.S. Cl. ...................................................... 327/553
(58) Field of Search ................................. 327/552, 553, 327/559, 554; 300/106, 107; 331/57

(56) References Cited

U.S. PATENT DOCUMENTS

| 3,838,351 A | * | 9/1974 | Hekimian | 330/104 |
| 3,946,328 A | * | 3/1976 | Boctor | 327/553 |
| 4,014,242 A | * | 3/1977 | Sanderson | 324/76.47 |
| 5,345,119 A | * | 9/1994 | Khoury | 327/553 |
| 5,914,633 A | * | 6/1999 | Comino et al. | 327/553 |

FOREIGN PATENT DOCUMENTS

| JP | 50-29258 | 3/1975 |
| JP | 8-139593 | 5/1996 |
| JP | 8-213877 | 8/1996 |

* cited by examiner

Primary Examiner—Dinh T. Le
(74) Attorney, Agent, or Firm—Young & Thompson

(57) ABSTRACT

An active filter has a least an operational amplifier, a plurality of resistances and a plurality of capacitances, at least one of the resistances and the consequences is variable by controlling a controller connected to an output side of the active filter for receiving an output signal so that the controller counts a frequency of the output signal to generate a counted value so as to control the variable resistances and capacitances on the basis of the counted value.

9 Claims, 8 Drawing Sheets

ACTIVE FILTER CIRCUIT

BACKGROUND OF THE INVENTION

The present invention relates to an active filter circuit and more particularly to an active filter circuit suitable to be incorporated into a semiconductor integrated circuit.

Figure 1:
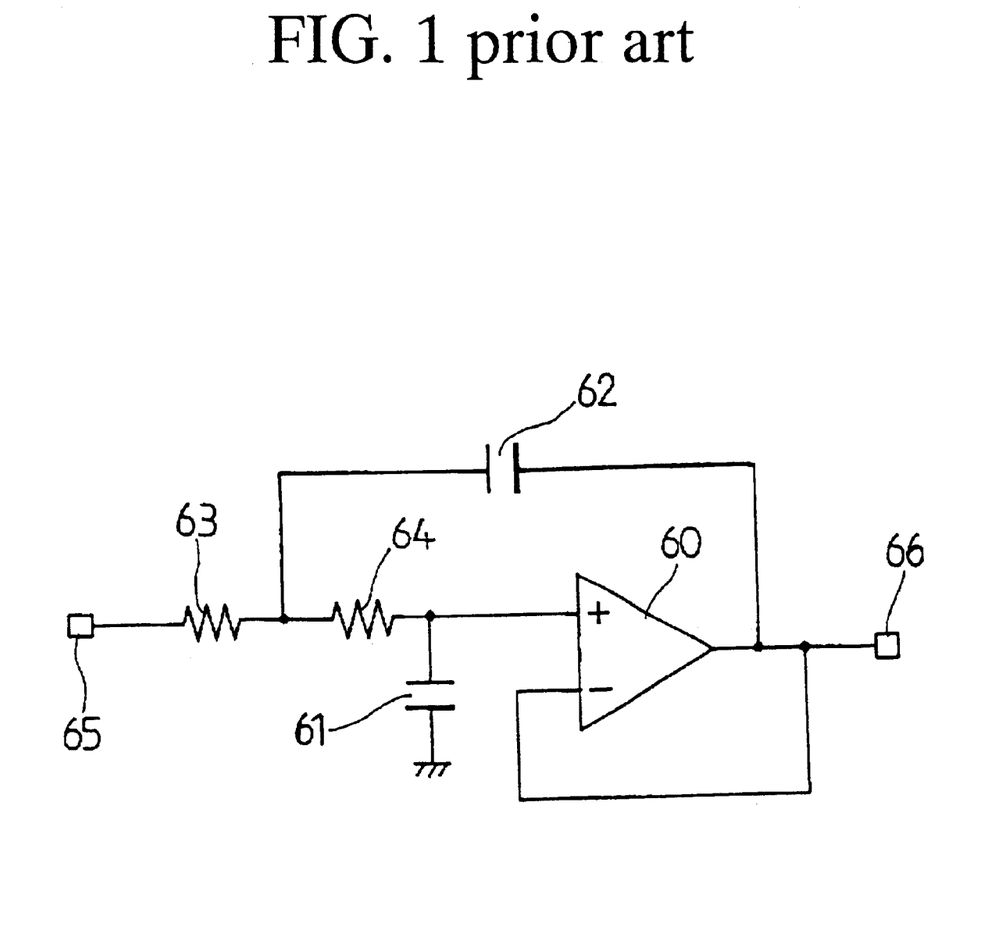
FIG. 1 is a circuit diagram illustrative of a conventional active filter circuit

FIG. 1 is a circuit diagram illustrative of a conventional active filter circuit. The conventional active filter circuit has an operational amplifier 60 having two inputs and a single outputs wherein an inverted input and the single output are connected to an output terminal 66 of the conventional active filter circuit, while a non-inverted input is connected through a capacitor 61 to a ground. The non-inverted input of the operational amplifier 60 is also connected through a series connection of two resistances 63 and 64 to an input terminal 65 of the conventional active filter circuit. An intermediate point between the two resistances 63 and 64 is also connected through a capacitor 62 to the output of the operational amplifier 60.

The above active filter acts as a low-pass filter. The first and second resistances 63 and 64 have the same resistance "R". The first capacitor 61 has a first capacitance "C" whilst the second capacitor 62 has a second capacitance "2C" which is larger by two times than the first capacitance. A cut-off frequency fcc of the active filter is given by $$fcc=1/\sqrt{(2\pi \times 2CR)} \quad (1).$$

Actually, however, it is difficult to form resistances and capacitances which accurately correspond to the design values on the semiconductor substrate for realizing the semiconductor integrated circuit. If the above conventional active filter circuit of FIG. 1 is formed in the semiconductor integrated circuit, then the resistances and capacitances are likely to be different from the design values, for which reason the cut-off frequency fcc is also likely to be different from the design value. If the design values are R=80 kΩ and C=60 pF, then the design value of the cut-off frequency fcc is found to be fcc=23.4 kHz in accordance with the above equation (1). Actuarially, however, if the actual resistance value is unintentionally increased by 15% up to R=92 kΩ and the actual capacitance is unintentionally increased by 13% up to C=68 pF, then the actual cut-off frequency fcc is fcc=18 kHz which is lower by 23% from the design value of fcc=23.4 kHz. Namely, the actual resistance and capacitance are displaced from the designed values, then the cut-off frequency is also displaced from the design value.

In ISSCC Digest of Technical Papers, pp. 172–173, Feb. 1996 entitled "Base and Filters for IS-95 CDMA Receiver Applications Featuring Digital Automatic Tuning," it is disclosed that rectangular waves are inputted into the above conventional active filter so that an output signal from the active filter is converted into a digital signal by an A/D converter in order to solve the above problems. This digital signal is operated by a digital signal processor so that in accordance with the operated digital signal, the resistance and capacitance are made varied to adjust the cut-off frequency. This technique is disadvantage in enlarged circuit scale due to provisions of the A/D converter and the digital signal processor.

In the above circumstances, it had been required to develop a novel active filter capable of controlling, resistance and capacitance to adjust a cut-off frequency to suppress variation in the cut-off frequency from a predetermined design value without, however, enlargement of circuit scale.

SUMMARY OF THE INVENTION

Accordingly, it is an object of the present invention to provide a novel active filter free from the above problems It is a flirter object of the present invention to provide a novel active filter capable of controlling resistance and capacitance to adjust a cut-off frequency to suppress variation in the cut-off frequency from a predetermined design value without, however, enlargement of circuit scale.

The present invention provides an active filter having at least an operational amplifier, a plurality of resistances and a plurality of capacitances, wherein at least one of the resistances and the capacitances is variable by controlling a controller connected to an output side of the active filter for receiving an output signal so that the controller counts a frequency of the output-signal to generate a counted value so as to control the at least variable one of the resistances and the capacitances on the basis of the counted value.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIG, 4 is a circuit diagram illustrative of a low pass filter as a second state of the novel active filter of FIG. 2.

DISCLOSURE OF THE INVENTION

The present invention provides an active filter having at least an operational amplifier, a plurality of resistances and a plurality of capacitances, wherein at least one of the resistances and the capacitances is variable by controlling a controller connected to an output side of the active filter for receiving an output signal so that the controller counts a frequency of the output signal to generate a counted value so as to control the at least variable one of the resistances and the capacitances on the basis of the counted value.

It is preferable that the controller comprises a counter connected to an output terminal of the active filter for receiving an output signal to count the frequency of the output signal and a decoder connected to the counter and also connected to the at least variable one of the resistances and the capacitances, so that the decoder decodes the counted value from the counter to generate a control signal which is to be transmitted to the variable one of the resistances and the capacitances for controlling the at least variable one of the resistances and the capacitances on the basis of the control signal.

It is preferable that the at least variable one of the resistances and the capacitances comprises at least a variable resistance.

It is preferable that the at least variable one of the resistances and the capacitances comprises at least a variable capacitance.

It is preferable that the at least variable one of the resistances and the capacitances comprises at least a variable capacitance and at least a variable resistance

PREFERRED EMBODIMENTS

First Embodiment

A first embodiment according to the present invention will be described in detail with reference to FIG. 2 which is a first novel active filter capable of controlling resistance and capacitance to adjust a cut-off frequency to suppress variation in the cat-off frequency from a predetermined design value in a first embodiment in accordance with the present invention.

The active filter has an operational amplifier 10 having two inputs and a single output, wherein the single output is connected to an output terminal 28 of the active filter while a non-inverted input is also connected through a third variable capacitor 18 to a ground and an inverted input is connected through a first switch 19 and a second resistance 12 to the ground A series connection of a third resistance 13, a second switch 20 and a fourth resistance 14 is provided between the non-inverted input of the operational amplifier 10 and an input terminal 27 of the active filter. The third resistance 13 is directly connected to the input terminal 27. The second switch 20 is connected between the third resistance 13 and the fourth resistance 14. The fourth resistance 14 is directly connected to the non-inverted input of the operational amplifier 10. The inverted input of the operational amplifier 10 is also connected through a first resistance 11 to the output of the operational amplifier 10. An intermediate point between the second switch 20 and the fourth resistance 14 is connected through a third switch 21 to the ground. The intermediate point between the second switch 20 and the fourth resistance 14 is further connected through a series connection of a fourth switch 22, a second variable capacitance 17 and an eighth switch 26 to the output terminal 28. The intermediate point between the second switch 20 and the fourth resistance 14 is further connected through a series connection of a sixth switch 24, a first variable capacitance 16, a seventh switch 25 and a fourth resistance 15 to the output terminal 28. An intermediate point between the fourth switch 22 and the second variable capacitance 17 is connected through a fifth switch 23 to an intermediate point between the fourth resistance 14 and the non-inverted input of the operational amplifier 10. An intermediate point between the first variable capacitance 16 and the seventh switch 25 is directly connected to the intermediate point between the second variable capacitance 17 and the eighth switch 26. Further, a counter 30 and a decoder 31 are provided. The counter 30 is connected to the output terminal 28 for receiving the output signal. The counter 30 is also connected to a clock terminal 29 for receiving clock signals so that the counter 30 is operated to count the clock signals on the basis of the output signal from the output terminal 28 to form a count value This count value is transmitted to the decoder 31. The decoder 31 is also connected to the first, second and third variable capacitors 16, 17 and 18. The decoder 31 generates control signals on the basis of the count value from the counter 30 to transmit the control signals to the first, second and third variable capacitors 16, 17 and 18 for controlling the variable capacitances of the first, second and third variable capacitors 16, 17 and 18.

Subsequent descriptions will focus on the operations of the active filter.

Figure 2:
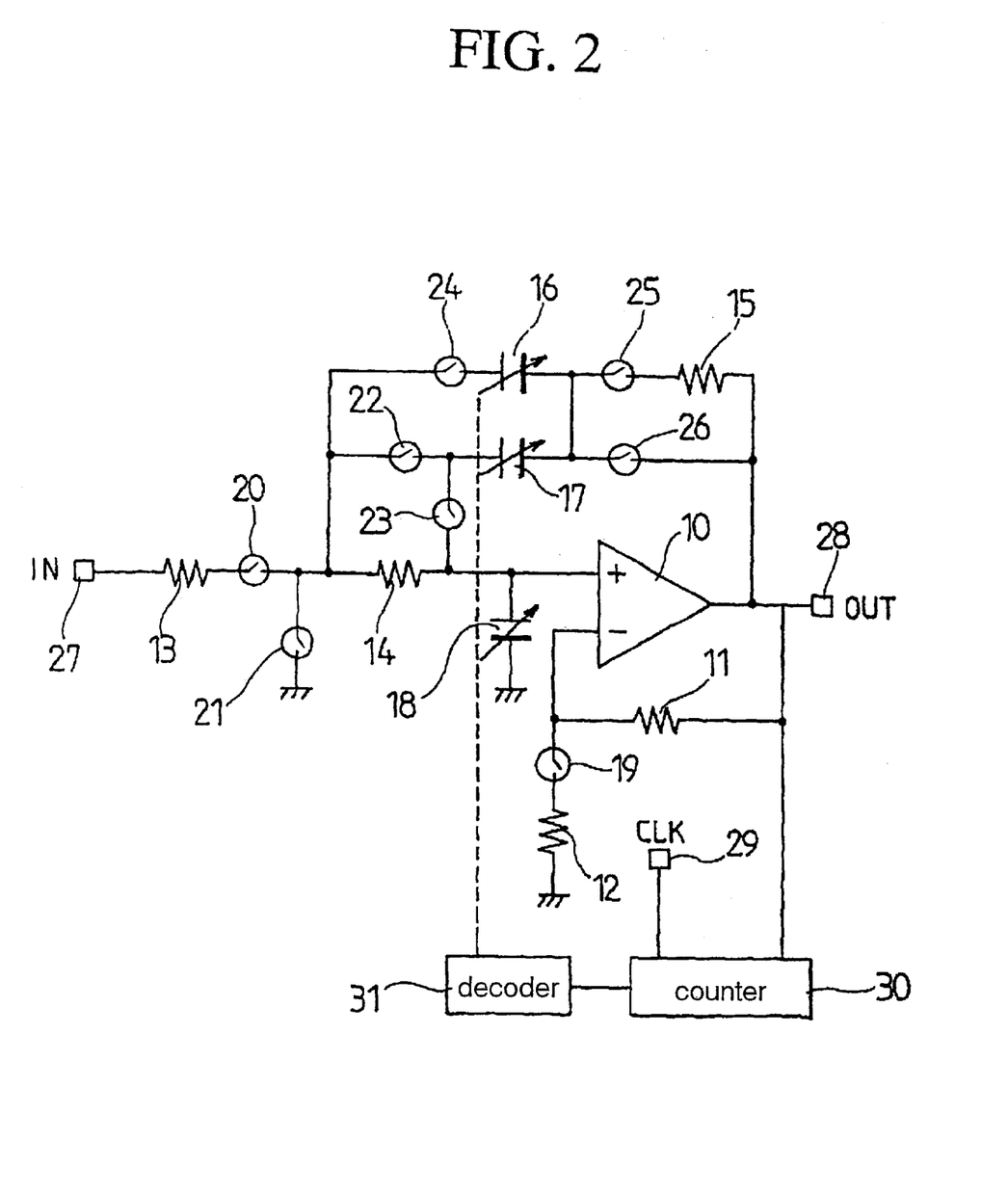
FIG. 2 is a circuit diagram illustrative of a first novel active filter capable of controlling resistance and capacitance to adjust a cut-off frequency to suppress variation in the cut-off frequency from a predetermined design value in a first embodiment in accordance with the present invention.
Figure 3:
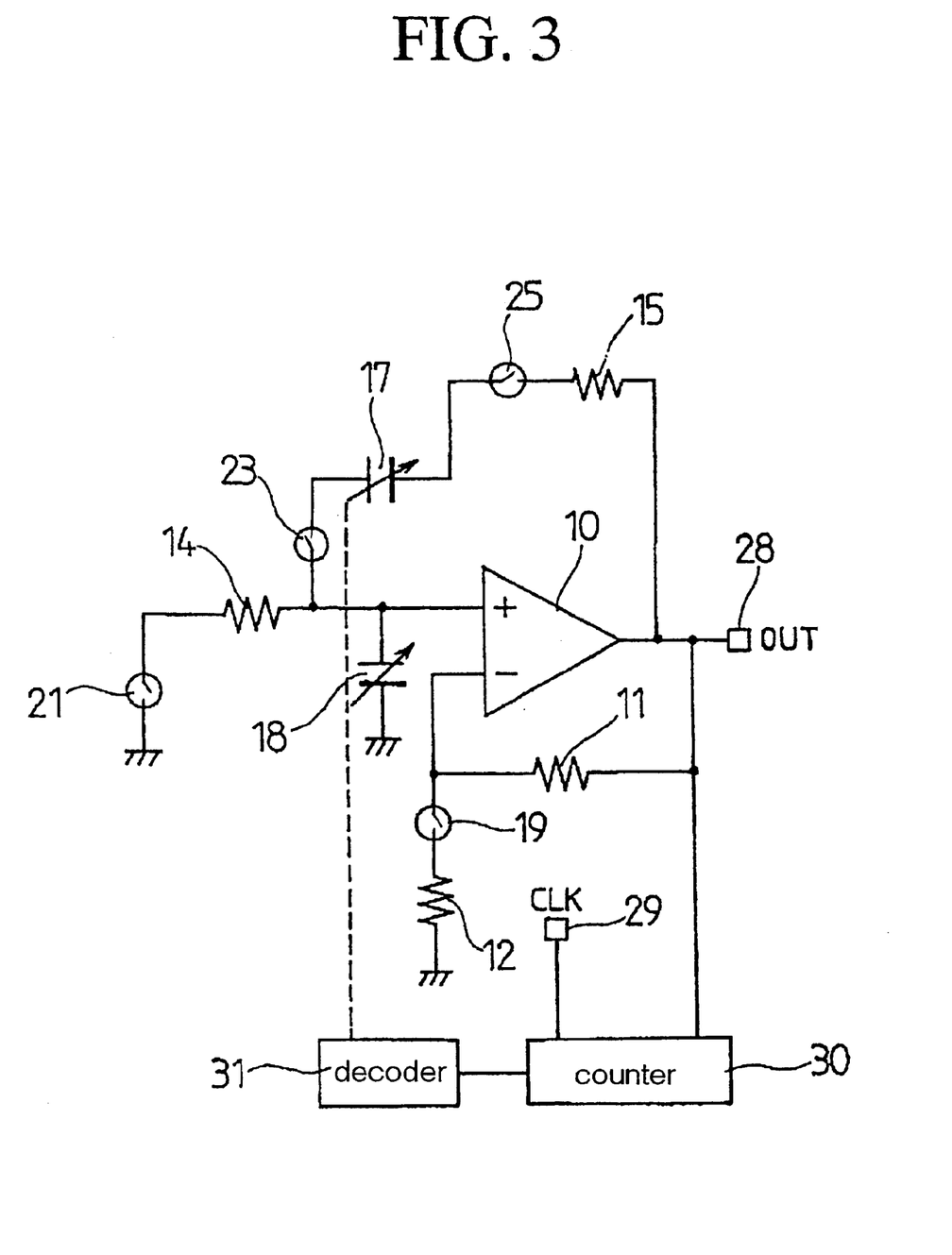
FIG. 3 is a circuit diagram illustrative of a Wien-Bridge oscillator as a first state of the novel active filter of FIG 2.

In order to place the active filter into a first state, the, first, third, fifth and seventh switches 19, 21, 23 and 25 turn ON while the second, fourth sixth and eighth switches 20, 22, 24 and 26 turn OFF thereby to form a Wien-Bridge oscillator of FIG. 3.

Figure 4:
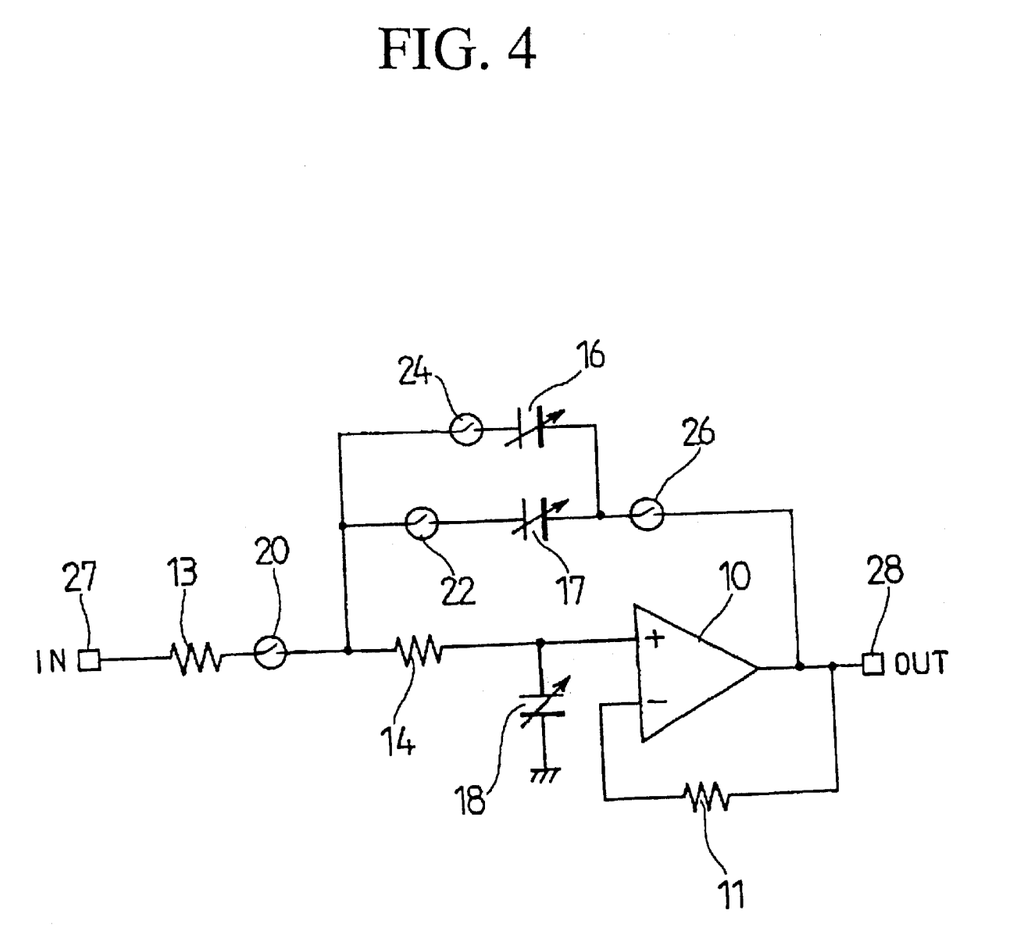

In order to place the active filter into a second state, the first, third, fifth and seventh switches 19, 21, 23 and 25 turn OFF while the second, fourth sixth and eighth switches 20, 22, 24 and 26 turn ON thereby to form a low-pass filter of FIG. 4.

In the first state of FIG. 3, if the fourth and fifth resistors 14 and 15 have a resistance "R", the first resistor 11 has a resistance "2r", the second resistor 12 has a resistence "r", the second and third variable capacitors 17 and 18 have a capacitance "C", then the oscillation frequency fo is given by:

$$fo=1/(2\pi CR) \qquad (2).$$

The oscillation signal having the above oscillation frequency fo is transmitted through the output terminal 28 into the counter 30. The counter 30 also receives the clock signals from the clock terminal 29. The counter 30 is operated to count the clock signal only when the oscillation signal is in positive side. If the clock frequency is fck, then the counter 30 is operated to count the clock signal so as to allow the following equation.

$$Fck=2m \times fo \qquad (3)$$

where m is the natural number. The counter 30 outputs "m" as the counted value. This "m" is the count value on design. If the Wien-Bridge oscillator of FIG. 3 is incorporated into the semiconductor integrated circuit, then resistance values of the resistors and the capacitance values are varied from the designed values and thus the oscillation frequency f is varied from the design value. Namely, the following equation is given.

$$fck=2 \, kf \qquad (4)$$

where f is the actual oscillation frequency and k is the counted value.

The decoder 31 decodes the counted value "k" to generate control signals which control the variable capacitances "C" of the second and third variable capacitors 17 and 18. In order to obtain f=fo, it is required k=m. If k<m, the control signal is to increase the variable capacitances "C" of the second and third variable capacitors 17 and 18. If k>m, the control signal is to decrease the variable capacitances "C" of the second and third variable capacitors 17 and 18. The following table 1 shows a relationship between the counted value "k" and the control signals of 4-bits (D0, D1, D2, D3).

TABLE 1

| Counted Value | D0 | D1 | D2 | D3 |
|---|---|---|---|---|
| 6 | 1 | 1 | 1 | 1 |
| 7 | 0 | 0 | 1 | 0 |
| 8 | 0 | 1 | 0 | 1 |
| 9 | 1 | 0 | 0 | 1 |
| 10 | 0 | 0 | 0 | 1 |
| 11 | 1 | 1 | 1 | 0 |
| 12 | 0 | 1 | 1 | 0 |
| 13 | 0 | 1 | 1 | 0 |
| 14 | 1 | 0 | 1 | 0 |
| 15 | 1 | 0 | 1 | 0 |

Figure 5:
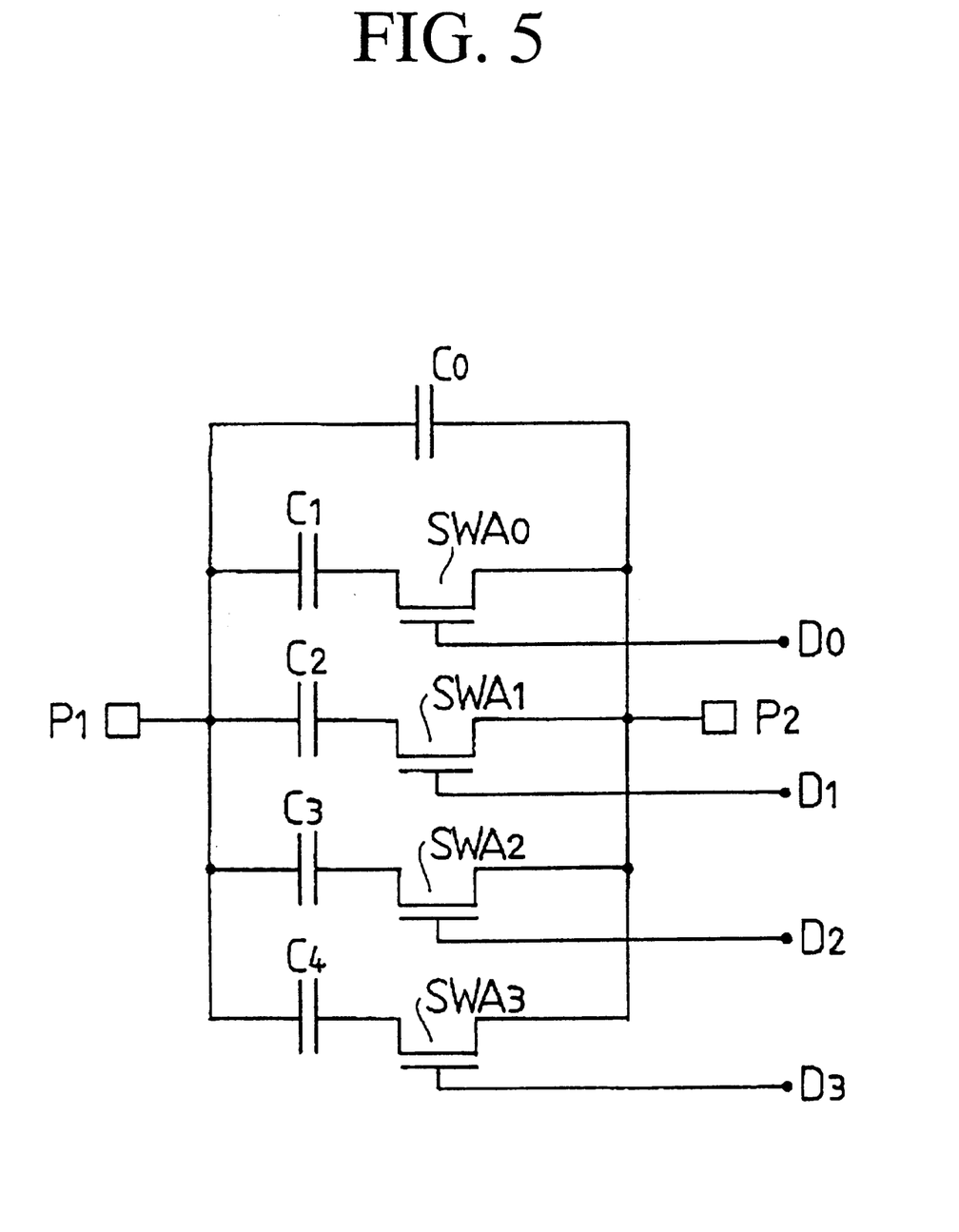
FIG. 5 is a circuit diagram illustrative of each of the second and third variable capacitors in the active filter of FIG. 2.

FIG. 5 is a circuit diagram illustrative of each of the second and third variable capacitors in the active filter of FIG. 2. A first capacitor C0 is connected between first ad second terminals P1 and P2. A first series connection of a capacitor C1 and a switch SWA0 is also connected between the first and second terminals P1 and P2, wherein the switch SWA0 is operated to switch ON/OFF in accordance with D0. If D0 is "1", then the switch SWA0 turns ON. If D0 is "0", then the switch SWA0 turns OFF. A second series connection of a capacitor C2 and a switch SWA1 is also connected between the first and second terminals P1 and P2, wherein the switch SWA1 is operated to switch ON/OFF in accordance with D1. If D1 is "1", then the switch SWA1 turns ON. If D1 is "0", then the switch SWA1 turns OFF. A third series connection of a capacitor C3 and a switch SWA2 is also connected between the first and second terminals P1 and P2, wherein the switch SWA2 is operated to switch ON/OFF in accordance with D2. If D2 is "1", then the switch SWA2 turns ON. If D2 is "0", then the switch SWA2 turns OFF. A fourth series connection of a capacitor C4 and a switch SWA3 is also connected between the first and second terminals P1 and P2, wherein the switch SWA3 is operated to switch ON/OFF in accordance with D3. If D3 is "1", then the switch SWA3 turns ON. If D3 is "0", then the switch SWA3 turns OFF.

The capacitances C1, C2, C3 and C4 are set to be the powers of the capacitance C0, so that C0=12 pF, C1=6 pF, C2=12 pF, C3=24 pF, and C4=48 pF. If the decoder 31 outputs the control signal (0001), then only the switch SWA4 turns ON whilst the remaining switches turn OFF, so that a capacitance C between the terminals P1 and P2 is given by $$C=C0+C4 \quad (5).$$

Namely, C=60 pF.

In the W=en-Bridge oscillator of FIG. 37 the fifth resistance 15 and the fourth resistance 14 are set to have a resistance of R=80 kΩ. The first resistance 11 is set to have a resistance 2r=20 kΩ. Te second resistance 12 is set to have a resistance r=10 kΩ. The second and third capacitors 17 and 18 are set to have a capacitance C=60 pF. The oscillation frequency of the output at the output terminal 28 is given by the above equation as follows.

$$fo=33.2 \text{ kHz} \quad (6)$$

The second and third capacitors 17 and 18 have the circuit configuration of FIG. 5. The control signal for satisfying C=60 pF between the terminals P1 and P2 is (0001). The count value "k" corresponding to (0001) is obtained from the above Table 1 to be k=10. This takes into account of the design value. This counted value "k" is equal to the count value "m".

$$\text{Namely, m}=10 \quad (7)$$

The equations (6) and (7) are substituted into the equation (3) to obtain the following clock frequency fck.

$$fck=664 \text{ kHz} \quad (8)$$

Under the above conditions, the switching operation is made to switch the Wien-Bridge oscillator of FIG. 3 into the low pass filter of FIG. 4. If the third and fourth resistances of the third and fourth resistors 13 and 14 are R and the first, second and third variable capacitors 16, 17 and 18 are set to have a capacitance C, then the cut-off frequency fc is given by $$fc=1/\sqrt{(2\pi \times 2C \times C \times R \times R)} \quad (9).$$

If R=80 kΩ and C=60 pF, then the cut-off frequency fc is given by the above equation (9) as follows.

$$fo=23.4 \text{ kHz} \quad (11).$$

Figure 6:
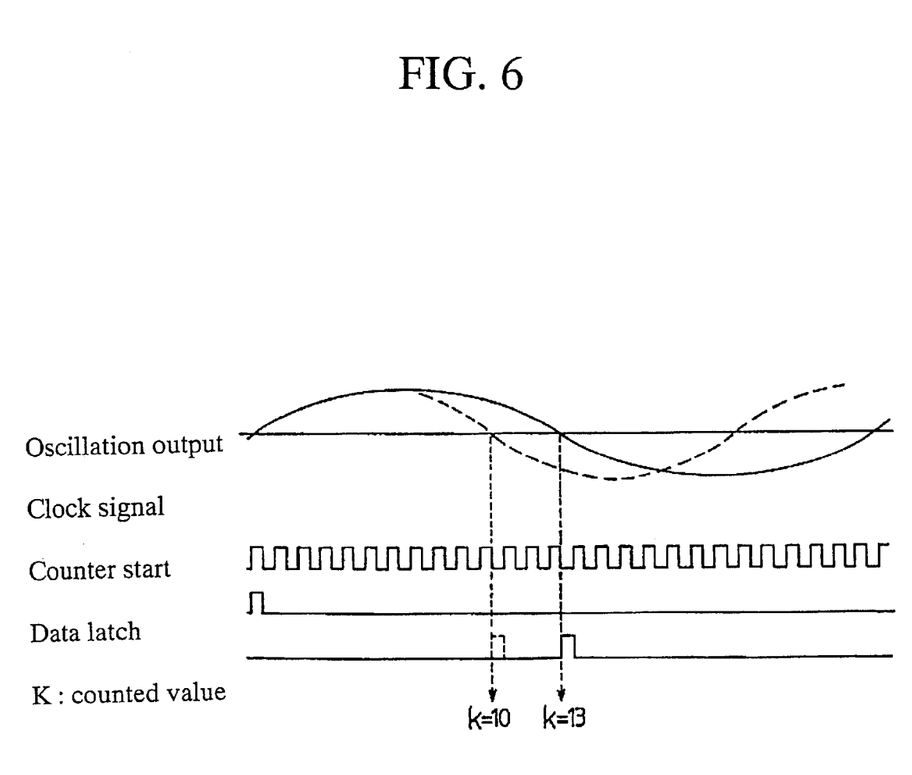
FIG. 6 is a timing chart of the active filter of FIG. 2.

FIG. 6 is a timing chart of the active filter of FIG. 2. If the resistances and capacitances correspond to the design values, then the oscillation output signal is given by the broken line wave form, wherein the counted value "k" is k=10(=m). If the active filter is incorporated into the semiconductor integrated circuit whereby the resistance value is increased by 15% to R=92 kΩ and the capacitance value is increased by 13% to C=68 pF, then the oscillation frequency fo of the Wien-Bridge oscillator of FIG. 3 is given by the above equation (2) as follows.

$$fo=255 \text{ kHz} \quad (11)$$

This corresponds to the oscillation frequency of design value. This value fo=25.5 kHz is lower by 235% than the value of the above equation (6).

When the oscillation frequency fo of the Wien-Bridge oscillator of FIG. 3 is changed into fo=255 kHz of the equation. (11), then the oscillation output wave form is shown by the real line wave forum On the basis of the counted value k=13, the corresponding control signal (0110) is outputted by the decoder 31 to control the variable capacitance of the variable capacitors. In this case, however, the capacitances C0, C1, C2 and C3 in FIG. 5 are also increased by 13%, for which reason the capacitance between the terminals P1 and P2 is given by $$C=C0+C2+C3=13.6+13.6+27.2=54.4 \text{ pF} \quad (13)$$

The low pass filter of FIG. 4 has the cut-off frequency fc which is given by the above equation (9) as follows.

$$fc=22.6 \text{ kHz} \quad (14)$$

This value is lower by only 3% than the value of the above equation (10). The conventional active filter has a larger difference of 23%. The above novel active filter is capable of suppressing variation in cut-off frequency by 20%.

As a modification to the above embodiment, the active filter in the first state may be T-bridge oscillator circuit or phase oscillator circuit, whilst the active filter in the second state may be high-pass filter or band-pass filter.

Figure 7:
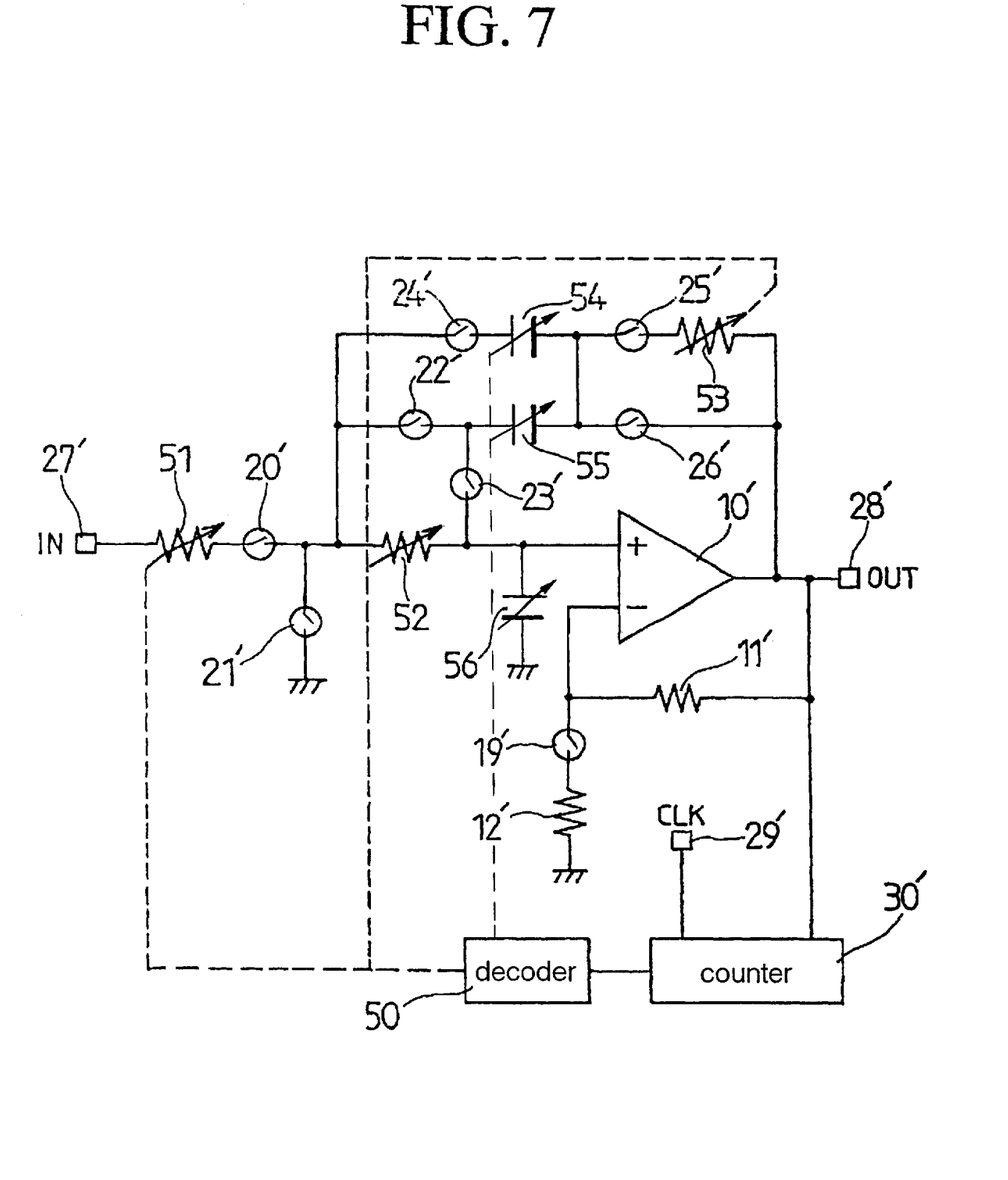
FIG. 7 is a second novel active filter capable of controlling resistance and capacitance to adjust a cut-off frequency to suppress variation in the cut-off frequency from a predetermined design value in a second embodiment in accordance with the present invention.

The resistors 13 and 14 may be variable as shown in FIG. 7.

As a further modification, the active filter may have a plurality of operational amplifiers to form state-variable filter.

Second Embodiment

A second embodiment according to the present invention will be described in detail with reference to FIG. 7 which is a second novel active filter capable of controlling resistance and capacitance to adjust a cut-off frequency to suppress variation in the cut-off frequency from a predetermined design value in a second embodiment in accordance with the present invention. In place of the variable capacitance, the resistance is variable to be controlled by the decoder.

The active filter has an operational amplifier 10 having two inputs and a single output, wherein the single output is connected to an output terminal 28 of the active filter whilst a non-inverted input is also connected through a third capacitor 56 to a ground and an inverted input is connected through a first switch 19' and a second resistance 15' to the ground. A series connection of a third variable resistance 51, a second switch 20' and a fourth variable resistance 52 is provided between the non-inverted input of the operational amplifier 10' and an input terminal 27 of the active filter. The third variable resistance 51 is directly connected to the input terminal 27. The second switch 20' is connected between the third variable resistance 51 and the fourth variable resistance 52. The fourth veritable resistance 52 is directly connected to the non-inverted input of the operational amplifier 10'. The inverted input of he operational amplifier 10' is also connected through a first resistance 11' to the output of the operational amplifier 10. An intermediate point between the second switch 20' and the forth variable resistance 52 is connected through a third switch 21' to the ground. The intermediate point between the second switch 20' and the fourth variable resistance 52 is filter connected through a series connection of a fourth switch 22', a second capacitor 17 and an eighth switch 26' to the output terminal 28'. The intermediate point between the second switch 20' and the fourth variable resistance 52 is further connected through a series connection of a sixth switch 24', a first capacitor 54', a seventh switch 25' and a fourth resistance 55' to the output terminal 28'. An intermediate point between the fourth switch 22' and the second capacitor 55' is connected through a fifth switch 23' to an intermediate point between the fourth variable resistance 52 and the non-inverted input of the operational amplifier 10'. An intermediate point between the first capacitor 54' and the seventh switch 25' is directly connected to the intermediate point between the second capacitor 55' and the eighth switch 26'. Further, a counter 30' and a decoder 50' are provided. The counter 30 is connected to the output terminal 28' for receiving the output signal The counter 30' is also connected to a clock terminal 29' for receiving clock signals so that the counter 30' is operated to count the clock signals on the basis of the output signal from the output terminal 28' to form a count value. This count value is transmitted to the decoder 50'. The decoder 50' is also connected to the variable third, fourth and fifth resistances 51, 52 and 53, The decoder 50 generates control signals on the basis of the count value from the counter 30' to transmit the control signals to the variable third, fourth and fifth resistances 51, 52 and 53 for controlling the resistances of the variable third, fourth and fifth resistances 51, 52 and 53.

Subsequent descriptions will focus on the operations of the active filter. Filter with respect to the variable resistors. Operation of the variable capacitors being similar to that already disclosed.

In order to place the active filter into a first state, the first, third, fifth and seventh switches, 19, 21, 23 and 25 turn ON while the second, fourth sixth and eighth switches 20, 22, 24 and 26 turn OFF thereby to form a Wien-Bridge oscillator.

In order to place the active filter into a second state, the first, third, fifth and seventh switches 19, 21, 23 and 25 turn OFF while the second, fourth sixth and eighth switches 20, 22, 24 and 26 turn ON thereby to form a low-pass filter.

In the first state, if the fourth and fifth resistors 52 and 53 have a resistance "R", the first resistor 11 has a resistance "2r", the second resistor 12 has a resistance "r", the second and third capacitors 55 and 56 have a capacitance "C", then the oscillation frequency fo is given by:

$$fo=1/(2\pi CR) \quad (15).$$

The oscillation signal having the above oscillation frequency fo is transmitted through the output terminal 28 into the counter 30. The counter 30 also receives the clock signals from the clock terminal 29. The counter 30 is operated to count the clock signal only when the oscillation signal is in positive side. If the clock frequency is fck, then the counter 30 is operated to count the clock signal so as to allow the following equation.

$$fck=2m \times fo \quad (16)$$

where m is the natural number. The counter 30 outputs "m" y as the counted value This "m" is the count value on design. If the Wien-Bridge oscillator is incorporated into the semiconductor integrated circuit, then resistance values of the resistors and the capacitance values are varied from the designed values and thus the oscillation frequency f is varied from the design value. Namely, the following equation is given.

$$fck=2 \ kf \quad (17)$$

where f is the actual oscillation frequency and k is the counted value.

The decoder 50 decodes the counted value "k" to generate control signals which control the resistances "R" of the variable fourth and fifth resistances 52 and 53. In order to obtain f=fo, it is required k=m. If k<m, the control signal is to increase the resistances "R" of the variable fourth and fifth resistances 52 and 53. If k>m, the control signal is to decrease the resistances "R" of the variable fourth and fifth resistances 52 and 53. The above table 1 shows a relationship between the counted value "k" and the control signals of 4-bits (D0, D1, D2, D3).

Figure 8:
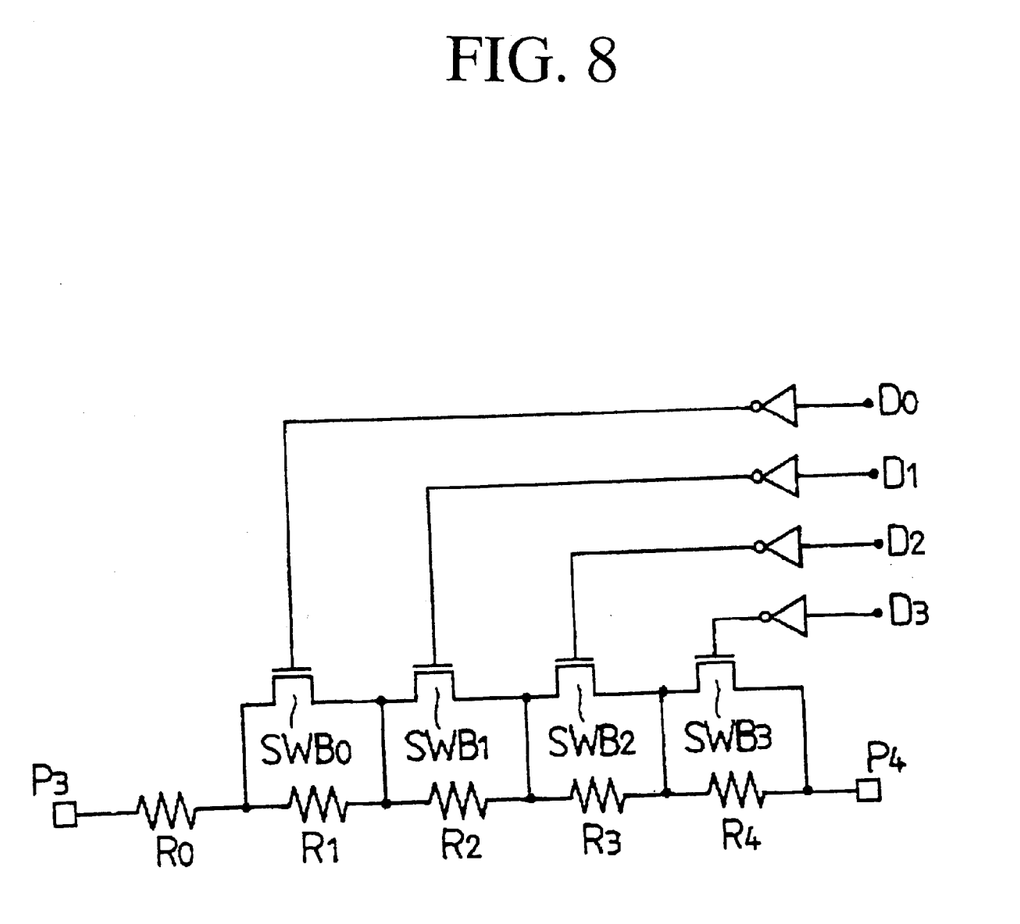
FIG. 8 is a circuit diagram illustrative of each of variable resistors in the active filter of FIG. 7.

FIG. 8 is a circuit diagram illustrative of each of the variable fourth and fifth resistances 52 and 53 in the active filter of FIG. 7. A series connection of resistances R0, R1, R2, R3, and R4 is connected between the terminals Poland P4. A switch SWB0 connected in parallel to the resistance R1. A switch SWB1 is connected in parallel to the resistance R2. A switch SWB2 is connected in parallel to the resistance R2. A switch SWB3 is connected in parallel to the resistance R3. The switch SWB0 is operated to switch ON/OFF in accordance with D0, wherein if D0 is "1", then the switch SWB0 turns OFF, whilst if D0 is "0", then the switch SWB2 turns ON. The switch SWB1 is operated to switch ON/OFF in accordance with D1, wherein if D1 is "1", then the switch SWB1 turns OFF, whilst if D1 is "0", then the switch SWB1 turns ON. The switch SWB2 is operated to switch ON/OFF in accordance with D2, wherein if D2 is "1", then the switch SWB2 turns OFF, whilst if D2 is "0", then the switch SWB2 turns ON. The switch SWB3 is operated to switch ON/OFF in accordance with D3, wherein if D3 is "0", then the switch SWB3 turns OFF, whilst if D3 is "0", then the switch SWB3 turns ON.

The resistances R0, R1, R2, R3 and R4 are set to be the powers of the resistance R0, so that R0=16 kΩ, R1=8 kΩ, R2=16 kΩ, R3=32 kΩ, and R4=64 kΩ. If the decoder 50 outputs the control signal (0001), then only the switch SWB4 turns OFF whilst the remaining switches turn ON, so that a capacitance C between the terminals P3 and P4 is given by $$R=R0+R4 \quad (5).$$

Namely, R=80 kΩ.

In the Wien-Bridge oscillator, the fifth variable resistance 53 and the fourth variable resistance 52 are set to have a resistance of R=80 kΩ. The first resistance 11 is set to have a resistance 2r=20 kΩ. The second resistance 12 is set to have a resistance r=10 kΩ. The second and third capacitors 55 and 56 are set to have a capacitance C=60 pF. The oscillation frequency of the output at the output terminal 28 is given by the above equation as follows.

$$f_o=33.2 \text{ kHz} \quad (19)$$

The fourth and fifth resistances 52 and 53 have the circuit configuration of FIG. 8. The control signal for satisfying R=80 kΩ between the terminals P3 and P4 is (0001). The count value "k" corresponding to (0001) is obtained from the above Table 1 to be k=10. This takes into account of the design value. This counted value "k" is equal to the count value "m".

$$\text{Namely, } m=10 \quad (20)$$

The equations (19) and (20) are substituted into the equation (17) to obtain the following clock frequency fck.

$$f_{ck}=664 \text{ kHz} \quad (21).$$

Under the above conditions, the switching operation is made to switch the Wien-Bridge oscillator into the low pass filter. If the third and fourth resistances of the third and fourth resistors 51 and 52 are R and the first, second and third capacitors 54, 55 and 56 are set to have a capacitance C, then the cutoff frequency fc is given by $$f_c=1/\sqrt{(2\pi \times 2C \times R \times R)} \quad (22)$$

If R=80 kΩ and C=60 pF, then the cut-off frequency fc is given by the above equation (9) as follows.

$$f_o=23.4 \text{ kHz} \quad (23).$$

FIG. 6 is also a timing chart of the active filter of FIG. 7. If the resistances and capacitances correspond to the design values, then the oscillation output signal is given by the broken line wave form, wherein the counted values "k" is k=10 (=m). If the active filter is incorporated into the semiconductor integrated circuit whereby the resistance value is increased by 15% to R=92 kΩ and the capacitance value is increased by 13% to C=68 pF, then the oscillation frequency fo of the Wien-Bridge oscillator is given by the above equation (15) as follows.

$$f_o=25.5 \text{ kHz} \quad (24)$$

This corresponds to the oscillation frequency of design value. This value fo=25.5 kHz is lower by 23% than the value of the above equation (22).

The cut-off frequency fc is given by the equation (22) as follows.

$$f_c=18 \text{ kHz} \quad (25)$$

This value fo=18 kHz is lower by 23% than the value of the above equation (23).

When the oscillation frequency fo of the Wien-Bridge oscillator is changed into fc=18 kHz of the equation (25), then the oscillation output wave form is shown by the real line wave form. On the basis of the counted value k=13, the corresponding control signal (0110) is outputted by the decoder 50 to control the capacitor of the capacitors. In this case, however, the resistances R0, R1, R2, R3 and R4 in FIG. 8 are also increased by 13%, for which reason the resistance between the terminals P3 and P4 is given by $$R=R0+R2+R3=18.4+18.4+36.8=73.6 \text{ pF} \quad (26).$$

The low pass filter has the cut-off frequency fc which is given by the above equation (22) as follows.

$$f_c=22.6 \text{ kHz} \quad (27)$$

This value is lower by only 3% than the value of the above equation (23). The conventional active filter has a larger difference of 23%. The above novel active filter is capable of suppressing variation in cut-off frequency by 20%.

As a modification to the above embodiment, the active filter in the first state may be T-bridge oscillator circuit or phase oscillator circuit, whilst the active filter in the second state may be high-pass filter or band-pass filter.

As a further modification, the active filter may have a plurality of operational amplifiers to form state-variable filter.

Whereas modifications of the present invention will be apparent to a person having ordinary skill ill the art, to which the invention pertains, it is to be understood that embodiments as shows and described by way of illustrations are by no means intended to be considered in a limiting sense. Accordingly, it is to be intended to cover by claims all modifications which fall within the spirit and scope of the present invention.

What is claimed is:

1. An active circuit comprising:
   a filter output terminal;
   an operational amplifier having an output connected to said output terminal;
   a first circuit being connected to input terminals and an output terminal of said operational amplifier, said first circuit including plural resistive elements and plural capacitive elements; and
   plural switching elements incorporated in said first circuit for configuring said active circuit as a selected one of a filter circuit and an oscillation circuit,
      wherein at least one of said resistive elements and capacitive elements comprises a variable element with a variable value, and
      said variable element is arranged to be variably controlled by a control circuit to re-set the variable value close to a predetermined value on a basis of a frequency of an oscillation output signal from said oscillation circuit when said oscillation circuit is configured by said switching elements.

2. The active circuit as claimed in claim 1, wherein said control circuit is connected to said filter output terminal and is also connected to said variable element for controlling the variable value to render the variable value close to said predetermined value on the basis of said frequency of said oscillation output signal from said oscillation circuit.

3. The active circuit as claimed in claim 2, wherein said control circuit counts the frequency of said oscillation output signal and also decodes a counted value.

4. The active circuit as claimed in claim 3, wherein said control circuit has a reference table which stores inter-correspondences between counted values and control signals, so that said control circuit generates a control signal which corresponds to said counted value.

5. The active circuit as claimed in claim 4, wherein said control circuit comprises:
- a counter connected to said filter output terminal of said active circuit for receiving said frequency of said oscillation output signal,
- said counter further receiving an external input of a clock signal for counting clock values of the clock signal during when said oscillation output signal takes a predetermined one of plus and minus values; and
- a decoder connected to said counter for receiving said counted value from said counter and decoding said counted value into said control signal,
- said decoder also being connected to said variable element for transmitting said control signal to said variable element for controlling'said variable value.

6. The active circuit as claimed in claim 5, wherein said oscillation circuit comprises a Wien-Bridge oscillation circuit.

7. The active circuit as claimed in claim 1, wherein said switching elements configure said active circuit as said filter circuit, after said variable value of said variable element has been re-set to the predetermined value.

8. The active circuit as claimed in claim 1, wherein said resistive elements comprise variable resistive elements.

9. The active circuit as claimed in claim 1, wherein said capacitive elements comprise variable capacitive elements.

* * * * *